United States Patent
Okada

[11] Patent Number: 6,143,434
[45] Date of Patent: Nov. 7, 2000

[54] ORGANIC ELECTROLUMINESCENT ELEMENT MATERIAL AND ORGANIC ELECTROLUMINESCENT ELEMENT EMPLOYING THE SAME

[75] Inventor: Hisashi Okada, Kanagawa, Japan

[73] Assignee: Fuji Photo Film Co., Ltd., Kanagawa, Japan

[21] Appl. No.: 09/086,554

[22] Filed: May 29, 1998

[30] Foreign Application Priority Data

Jul. 4, 1997 [JP] Japan .................................. 9-179274
Mar. 3, 1998 [JP] Japan ................................ 10-050798

[51] Int. Cl.⁷ ........................................... H05B 33/14
[52] U.S. Cl. .................... 428/690; 428/917; 313/502; 313/504; 313/506
[58] Field of Search .................... 428/690, 917; 313/502, 504, 506

[56] References Cited

U.S. PATENT DOCUMENTS 4,769,292   9/1988   Tang et al. ............................... 428/690

FOREIGN PATENT DOCUMENTS 62-187767   8/1987   Japan .
63-263792  10/1988   Japan .
2-172916    7/1990   Japan .

*Primary Examiner*—Marie Yamnitzky
*Attorney, Agent, or Firm*—Sughrue, Mion, Zinn, Macpeak & Seas, PLLC

[57] ABSTRACT

An organic electroluminescent element material, which is a compound represented by the following formula (I):

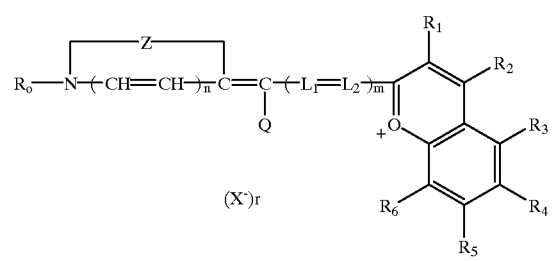

wherein $R_1$, $R_2$, $R_3$, $R_4$, $R_5$, and $R_6$ each represents a hydrogen atom or a substituent; Z represents a group of atoms necessary for forming a five- or six-membered ring; $R_0$ represents an aliphatic hydrocarbon group, an aryl group, or a heterocyclic group; n represents 0 or 1; $L_1$ and $L_2$ each represents a methine group or a substituted methine group, provided that plural $L_1$'s, plural $L_2$'s, or $L_1$ and $L_2$ as a whole may form a four- to six-membered ring formed through substituents thereof; m represents 0, 1, 2, or 3; Q represents a hydrogen atom, an aliphatic hydrocarbon group, an aryl group, or a heterocyclic group, provided that Q may be bonded to $R_0$ to form a ring; $X^-$ represents an anion; and r represents an integer of 0 or larger, provided that r is 0 when the compound forms an intramolecular salt. An electroluminescent element employing the same, which can attain a high luminance and a high luminescent efficiency at a low driving voltage and has excellent stability in repetitions of use.

2 Claims, No Drawings

ORGANIC ELECTROLUMINESCENT ELEMENT MATERIAL AND ORGANIC ELECTROLUMINESCENT ELEMENT EMPLOYING THE SAME

FIELD OF THE INVENTION

The present invention relates to a luminescent material for an organic electroluminescent (EL) element used in a flat illuminant or display and to a high-luminance luminescent element. More particularly, this invention relates to a luminescent material which can highly efficiently emit a yellow to red high-luminance light at a low applied voltage and to an EL element employing the same.

BACKGROUND OF THE INVENTION

Organic EL elements employing organic substances are thought to have promising use as an inexpensive, large-area, full-color display element of the solid luminescence type, and many organic EL elements are being developed. In general, an organic EL element is constituted of a luminescent layer and a pair of facing electrodes between which the luminescent layer is interposed. When an electric field is applied to both electrodes, electrons are injected from the cathode and holes are injected from the anode. The electrons recombine with the holes in the luminescent layer and the energy level returns from the conduction band to the valence band, upon which energy is emitted as light. This phenomenon is luminescence.

Conventional organic EL elements have had problems of high driving voltage, low luminance, low luminescent efficiency, and considerable property deterioration. Recently, an organic EL element having a thin layer containing an organic compound which has such a high fluorescent quantum efficiency that it luminesces at a voltage as low as 10 V or below was reported (see *Applied Physics Letters*, Vol.51, p.913, 1987), and attention is now focused thereon. In this technique, a metal chelate complex, a fluorescent band layer, and an amine compound are used in a hole-injecting layer to obtain high-luminance green luminescence, and the luminance reaches several thousands of candelas per $m^2$ at a DC voltage of 6 to 7 V.

However, from the standpoint of practical use in a full-color display as an illuminant, the three primary colors or white color should be emitted. Since the above prior art element employs a complex of 8-quinolinol with aluminum (Alq), the luminescence thereof is green. An element doped with a fluorescent dye has been reported as an improvement of the above element (see *Journal of Applied Physics*, Vol.65, p.3610, 1989). In this improvement, 4-(dicyanomethylene)-2-methyl-6-(4-dimethylaminostyryl)-4H-pyran (DCM) is used as a dopant to obtain red luminescence. However, the above improved element has problems of low durability, etc., and is hence unable to be put to practical use. Although various EL elements which likewise employ a fluorescent material as a dopant and hence emit lights having longer wavelengths than green have been developed, all these EL elements still have an insufficient luminance and have the serious problem that the stability thereof in repetitions of use is poor.

On the other hand, the organic EL elements which have attained a high luminance are those having a layer of an organic substance formed by vacuum vapor deposition. Although element production using a coating technique is desirable from the standpoints of the simplification of production process, processability, increase in element area, etc., the elements produced using any conventional coating technique are inferior in luminance and luminescent efficiency to the elements produced using vacuum vapor deposition. Thus, an important subject has been to heighten luminance and luminescent efficiency.

SUMMARY OF THE INVENTION

An object of the present invention is to provide an organic EL element which can attain a high luminance and a high luminescent efficiency at a low driving voltage and has excellent stability in repetitions of use. Another object of the present invention is to provide an organic EL element. More particularly, the objects are to provide a luminescent material which emits a high-luminance red light having a satisfactory color tone, a luminescent material effective for white luminescence, and an organic EL element employing the same.

The above objects are accomplished with the following means.

(1) An organic electroluminescent element material which is a compound represented by the following formula (I):

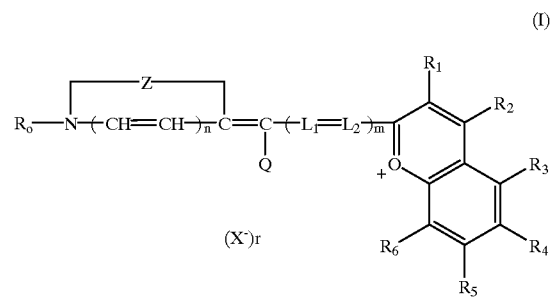

wherein $R_1$, $R_2$, $R_3$, $R_4$, $R_5$, and $R_6$ each represents a hydrogen atom or a substituent; Z represents a group of atoms necessary for forming a five- or six-membered ring; $R_0$ represents an aliphatic hydrocarbon group, an aryl group, or a heterocyclic group; n represents 0 or 1; $L_1$ and $L_2$ each represents a methine group or a substituted methine group, provided that plural $L_1$'s, plural $L_2$'s, or $L_1$ and $L_2$ as a whole may form a four- to six-membered ring formed through substituents thereof; m represents 0, 1, 2, or 3; Q represents a hydrogen atom, an aliphatic hydrocarbon group, an aryl group, or a heterocyclic group, provided that Q may be bonded to $R_0$ to form a ring; $X^-$ represents an anion; and r represents an integer of 0 or larger, provided that r is 0 when the compound forms an intramolecular salt.

(2) An organic electroluminescent element comprising a pair of electrodes and, formed therebetween, either a luminescent layer or plural thin organic-compound layers containing a luminescent layer, at least one of said layers being a layer containing the organic electroluminescent element material described in (1) above.

(3) An organic electroluminescent element comprising a pair of electrodes and, formed therebetween, either a luminescent layer or plural thin organic-compound layers containing a luminescent layer, at least one of said layers being a layer comprising a polymer and, dispersed therein, the organic electroluminescent element material described in (1) above.

DETAILED DESCRIPTION OF THE INVENTION

The compound represented by formula (I) according to the present invention will be explained first in detail.

$R_1$, $R_2$, $R_3$, $R_4$, $R_5$, and $R_6$ each represents a hydrogen atom or a substituent. Examples of the substituent represented by $R_1$, $R_2$, $R_3$, $R_4$, $R_5$, or $R_6$ include alkyl groups (having preferably 1 to 20, more preferably 1 to 12, most preferably 1 to 8 carbon atoms, e.g., methyl, ethyl, isopropyl, tert-butyl, n-octyl, n-decyl, n-hexadecyl, cyclopropyl, cyclopentyl, and cyclohexyl), alkenyl groups (having preferably 2 to 20, more preferably 2 to 12, most preferably 2 to 8 carbon atoms, e.g., vinyl, allyl, 2-butenyl, and 3-pentenyl), alkynyl groups (having preferably 2 to 20, more preferably 2 to 12, most preferably 2 to 8 carbon atoms, e.g., propargyl and 3-pentynyl), aryl groups (having preferably 6 to 30, more preferably 6 to 20, most preferably 6 to 12 carbon atoms, e.g., phenyl, p-methylphenyl, and naphthyl), amino groups (having preferably 0 to 20, more preferably 0 to 10, most preferably 0 to 6 carbon atoms, e.g., amino, methylamino, dimethylamino, diethylamino, and dibenzylamino), alkoxy groups (having preferably 1 to 20, more preferably 1 to 12, most preferably 1 to 8 carbon atoms, e.g., methoxy, ethoxy, and butoxy), aryloxy groups (having preferably 6 to 20, more preferably 6 to 16, most preferably 6 to 12 carbon atoms, e.g., phenyloxy and 2-naphthyloxy), acyl groups (having preferably 1 to 20, more preferably 1 to 16, most preferably 1 to 12 carbon atoms, e.g., acetyl, benzoyl, formyl, and pivaloyl), alkoxycarbonyl groups (having preferably 2 to 20, more preferably 2 to 16, most preferably 2 to 12 carbon atoms, e.g., methoxycarbonyl and ethoxycarbonyl), aryloxycarbonyl groups (having preferably 7 to 20, more preferably 7 to 16, most preferably 7 to 10 carbon atoms, e.g., phenyloxycarbonyl), acyloxy groups (having preferably 2 to 20, more preferably 2 to 16, most preferably 2 to 10 carbon atoms, e.g., acetoxy and benzoyloxy), acylamino groups (having preferably 2 to 20, more preferably 2 to 16, most preferably 2 to 10 carbon atoms, e.g., acetylamino and benzoylamino), alkoxycarbonylamino groups (having preferably 2 to 20, more preferably 2 to 16, most preferably 2 to 12 carbon atoms, e.g., methoxycarbonylamino), aryloxycarbonylamino groups (having preferably 7 to 20, more preferably 7 to 16, most preferably 7 to 12 carbon atoms, e.g., phenyloxycarbonylamino), sulfonylamino groups (having preferably 1 to 20, more preferably 1 to 16, most preferably 1 to 12 carbon atoms, e.g., methanesulfonylamino and benzenesulfonylamino), sulfamoyl groups (having preferably 0 to 20, more preferably 0 to 16, most preferably 0 to 12 carbon atoms, e.g., sulfamoyl, methylsulfamoyl, dimethylsulfamoyl, and phenylsulfamoyl), carbamoyl groups (having preferably 1 to 20, more preferably 1 to 16, most preferably 1 to 12 carbon atoms, e.g., carbamoyl, methylcarbamoyl, diethylcarbamoyl, and phenylcarbamoyl), alkylthio groups (having preferably 1 to 20, more preferably 1 to 16, most preferably 1 to 12 carbon atoms, e.g., methylthio and ethylthio), arylthio groups (having preferably 6 to 20, more preferably 6 to 16, most preferably 6 to 12 carbon atoms, e.g., phenylthio), sulfonyl groups (having preferably 1 to 20, more preferably 1 to 16, most preferably 1 to 12 carbon atoms, e.g., mesyl and tosyl), sulfinyl groups (having preferably 1 to 20, more preferably 1 to 16, most preferably 1 to 12 carbon atoms, e.g., methanesulfinyl and benzenesulfinyl), ureido groups (having preferably 1 to 20, more preferably 1 to 16, most preferably 1 to 12 carbon atoms, e.g., ureido, methylureido, and phenylureido), phosphoramido groups (having preferably 1 to 20, more preferably 1 to 16, most preferably 1 to 12 carbon atoms, e.g., diethylphosphoramido and phenylphosphoramido), hydroxy, mercapto, halogen atoms (e.g., fluorine, chlorine, bromine, and iodine), cyano, sulfo, carboxyl, nitro, hydroxamic acid groups, sulfino, hydrazino, imino, and heterocyclic groups (which contain one or more hetero atoms such as nitrogen, oxygen, sulfur, and selenium atoms and have preferably 1 to 30, more preferably 1 to 20 carbon atoms; e.g., imidazolyl, pyridyl, furyl, piperidyl, and morpholino). These substituents may be further substituted. In the case where two or more substituents are present, these may be the same or different.

Preferred examples of the substituents are alkyl groups, alkenyl groups, aralkyl groups, aryl groups, amino groups, acyl groups, alkoxycarbonyl groups, aryloxycarbonyl groups, carbonylamino groups, sulfonylamino groups, sulfamoyl groups, carbamoyl groups, hydroxy, and heterocyclic groups. More preferred of these are alkyl groups, alkenyl groups, aralkyl groups, aryl groups, amino groups, carbonylamino groups, sulfonylamino groups, and heterocyclic groups. Most preferred of these are alkyl groups, aralkyl groups, aryl groups, amino groups, carbonylamino groups, sulfonylamino groups, hydroxy, and heterocyclic groups.

$R_5$ is especially preferably a substituted or unsubstituted amino group or a hydroxy group, and is most preferably a substituted or unsubstituted amino group.

The substituted or unsubstituted amino group is a group represented by $-NR_{5a}(R_{5b})$, wherein $R_{5a}$ and $R_{5b}$ may be the same or different and each represents a hydrogen atom, an aliphatic hydrocarbon group, an aryl group, or a heterocyclic group. Preferred examples of $R_{5a}$ and $R_{5b}$ include a hydrogen atom, alkyl groups (preferably, substituted or unsubstituted alkyl groups having 1 to 8 carbon atoms (examples of the substituents may be the same as those enumerated hereinabove as examples of $R_1$ to $R_6$), e.g., methyl, ethyl, propyl, and butyl), acyl groups (preferably, substituted or unsubstituted acyl groups having 1 to 8 carbon atoms (examples of the substituents may be the same as those enumerated hereinabove as examples of $R_1$ to $R_6$), e.g., acetyl, propionyl, and benzoyl), alkoxycarbonyl groups (preferably, substituted or unsubstituted alkoxycarbonyl groups having 1 to 8 carbon atoms (examples of the substituents may be the same as those enumerated hereinabove as examples of $R_1$ to $R_6$), e.g., methoxycarbonyl, ethoxycarbonyl, and benzyloxycarbonyl), aryloxycarbonyl groups (preferably, substituted or unsubstituted aryloxycarbonyl groups having 1 to 10 carbon atoms (examples of the substituents may be the same as those enumerated hereinabove as examples of $R_1$ to $R_6$), e.g., phenoxycarbonyl), and sulfonyl groups (preferably, substituted or unsubstituted sulfonyl groups having 1 to 10 carbon atoms (examples of the substituents may be the same as those enumerated hereinabove as examples of $R_1$ to $R_6$), e.g., methanesulfonyl and benzenesulfonyl). More preferred of these are a hydrogen atom and alkyl groups. $R_{5a}$ and $R_{5b}$ may be bonded to each other to form a five- or six-membered ring. It is also preferred that $R_{5a}$ and $R_{5b}$ be bonded to the benzene ring of the benzopyrylium ring to form a fused ring.

Z represents a group of atoms necessary for forming a five- or six-membered ring. The ring containing Z may have one or more substituents (examples of the substituents may be the same as those enumerated hereinabove as examples of $R_1$ to $R_6$), and may have been fused to another ring.

Examples of the ring containing Z include thiazole nuclei (e.g., thiazole, 4-methylthiazole, 4-phenylthiazole, 5-methylthiazole, 5-phenylthiazole, 4,5-dimethylthiazole, 4,5-diphenylthiazole, and (2-thienyl)thiazole), benzothiazole nuclei (e.g., benzothiazole, 4-chlorobenzothiazole, 5-chlorobenzothiazole, 6-chlorobenzothiazole, 7-chlorobenzothiazole, 4-methylbenzothiazole, 5-methylbenzothiazole, 6-methylbenzothiazole, 5,6-dimethylbenzothiazole, 5-bromobenzothiazole, 6-bromobenzothiazole, 5-trifluoromethylbenzothiazole, 5-phenylbenzothiazole, 4-methoxybenzothiazole, 5-methoxybenzothiazole, 6-methoxybenzothiazole, 5-carboxybenzothiazole, 5-cyanobenzothiazole, 5-fluorobenzothiazole, 5-ethoxybenzothiazole, tetrahydrobenzothiazole, 5,6-dimethoxybenzothiazole, 5-hydroxybenzothiazole, and 6-hydroxybenzothiazole), naphthothiazole nuclei (e.g., naphtho[1,2-d]thiazole, naphtho[2,1-d]thiazole, naphtho[2,3-d]thiazole, 5-methoxynaphtho[2,1-d]thiazole, 5-ethoxynaphtho[2,1-d]thiazole, 8-methoxynaphtho[1,2-d]thiazole, and 7-methoxynaphtho[1,2-d]thiazole), thiazoline nuclei (e.g., thiazoline, 4-methylthiazoline, and 4-phenylthiazoline), oxazole nuclei (e.g., oxazole, 4-methyloxazole, 5-methyloxazole, 4-phenyloxazole, 5-phenyloxazole, and 4,5-diphenyloxazole), benzoxazole nuclei (e.g., benzoxazole, 5-chlorobenzoxazole, 5-methylbenzoxazole, 5-phenylbenzoxazole, 6-methylbenzoxazole, 5,6-dimethylbenzoxazole, 4,6-dimethylbenzoxazole, 5-methoxybenzoxazole, 5-ethoxybenzoxazole, 5-fluorobenzoxazole, 6-methoxybenzoxazole, 5-hydroxybenzoxazole, and 6-hydroxybenzoxazole), naphthoxazole nuclei (e.g., naphtho[1,2-d]oxazole, naphtho[2,1-d]oxazole, and naphtho[2,3-d]oxazole), isoxazole nuclei (e.g., 5-methylisoxazole and benzoisoxazole), oxazoline nuclei (e.g., 4,4-dimethyloxazoline), selenazole nuclei (e.g., 4-methylselenazole, 4-nitroselenazole, and 4-phenylselenazole), benzoselenazole nuclei (e.g., benzoselenazole, 5-methylbenzoselenazole, 5-chlorobenzoselenazole, 5-nitrobenzoselenazole, 5-methoxybenzoselenazole, 5-hydroxybenzoselenazole, 6-nitrobenzoselenazole, and 5-chloro-6-nitrobenzoselenazole), naphthoselenazole nuclei (e.g., naphtho[1,2-d]selenazole and naphtho[2,1-d]selenazole), tetrazole nuclei (e.g., benzotetrazole, 5-methylbenzotetrazole, 5,6-dimethylbenzotetrazole, 5-methoxybenzotetrazole, 5-hydroxybenzotetrazole, 5-methylthiobenzotetrazole, 5,6-dimethoxybenzotetrazole, naphtho[1,2-d]tetrazole, 6-methylnaphtho[1,2-d]tetrazole, and 6-methoxynaphtho[1,2-d]tetrazole), indolenine nuclei (e.g., 3,3-dimethylindolenine, 3,3-diethylindolenine, 3,3-dimethyl-5-cyanoindolenine, 3,3-dimethyl-5-nitroindolenine, 3,3-dimethyl-6-nitroindolenine, 3,3-dimethyl-5-methoxyindolenine, 3,3,5-trimethylindolenine, and 3,3-dimethyl-5-chloroindolenine), imidazole nuclei (e.g., 1-methylimidazole, 1-ethylimidazole, 1-propylimidazole, 1-ethyl-4-phenylimidazole, and 1-phenylimidazole), benzimidazole nuclei (e.g., 1-ethylbenzimidazole, 1-ethyl-5-chlorobenzimidazole, 1-propyl-5,6-dichlorobenzimidazole, 1-ethyl-5-methoxybenzimidazole, 1-ethyl-5-cyanobenzimidazole, 1-ethyl-5-fluorobenzimidazole, 1-ethyl-5-trifluoromethylbenzimidazole, 1-butyl-6-chloro-5-cyanobenzimidazole, 1-ethyl-6-chloro-5-trifluoromethylbenzimidazole, 1-allyl-5-chlorobenzimidazole, 1-allyl-5,6-dichlorobenzimidazole, 1-phenylbenzimidazole, 1-phenyl-5-chlorobenzimidazole, 1-phenyl-5,6-dichlorobenzimidazole, 1-phenyl-5-methoxybenzimidazole, and 1-phenyl-5-cyanobenzimidazole), naphthoimidazole nuclei (e.g., 1-ethylnaphtho-[1,2-d]imidazole and 1-phenylnaphtho[1,2-d]imidazole), pyridine nuclei (e.g., 2-pyridine, 4-pyridine, 5-methyl-2-pyridine, and 3-methyl-4-pyridine), quinoline nuclei (e.g., 2-quinoline, 3-methyl-2-quinoline, 5-ethyl-2-quinoline, 6-methyl-2-quinoline, 6-nitro-2-quinoline, 8-fluoro-2-quinoline, 6-methoxy-2-quinoline, 6-hydroxy-2-quinoline, 8-chloro-2-quinoline, 4-quinoline, 6-ethoxy-4-quinoline, 6-nitro-4-quinoline, 8-chloro-4-quinoline, 8-fluoro-4-quinoline, 8-methyl-4-quinoline, and 8-methoxy-4-quinoline), isoquinoline nuclei (e.g., isoquinoline, 6-nitro-1-isoquinoline, 3,4-dihydro-1-isoquinoline, and 6-nitro-3-isoquinoline), imidazo[4,5-b]quinoxaline nuclei (e.g., 1,3-diethylimidazo[4,5-b]quinoxaline and 6-chloro-1,3-diallylimidazo[4,5-b]quinoxaline), oxadiazole nuclei, thiadiazole nuclei, triazole nuclei, tetrazole nuclei, pyrimidine nuclei, and pyrazole nuclei.

Preferred examples of the ring formed with Z include thiazole nuclei, benzothiazole nuclei, naphthothiazole nuclei, thiazoline nuclei, oxazole nuclei, benzoxazole nuclei, naphthoxazole nuclei, isoxazole nuclei, oxazoline nuclei, selenazole nuclei, benzoselenazole nuclei, naphthoselenazole nuclei, tetrazole nuclei, indolenine nuclei, imidazole nuclei, benzimidazole nuclei, naphthoimidazole nuclei, pyridine nuclei, quinoline nuclei, and isoquinoline nuclei. More preferred of these are benzothiazole nuclei, naphthothiazole nuclei, benzoxazole nuclei, naphthoxazole nuclei, benzoselenazole nuclei, naphthoselenazole nuclei, indolenine nuclei, benzimidazole nuclei, naphthoimidazole nuclei, pyridine nuclei, and quinoline nuclei. Most preferred of these are benzothiazole nuclei, naphthothiazole nuclei, benzoxazole nuclei, naphthoxazole nuclei, benzoselenazole nuclei, naphthoselenazole nuclei, indolenine nuclei, benzimidazole nuclei, and naphthoimidazole nuclei.

$R_0$ represents an aliphatic hydrocarbon group, an aryl group, or a heterocyclic group.

Examples of the aliphatic hydrocarbon group represented by $R_0$ include linear, branched, or cyclic alkyl groups (having preferably 1 to 30, more preferably 1 to 20, most preferably 1 to 12 carbon atoms, e.g., methyl, ethyl, isopropyl, tert-butyl, n-octyl, n-decyl, n-hexadecyl, cyclopropyl, cyclopentyl, and cyclohexyl), alkenyl groups (having preferably 2 to 30, more preferably 2 to 20, most preferably 2 to 12 carbon atoms, e.g., vinyl, allyl, 2-butenyl, and 3-pentenyl), alkynyl groups (having preferably 2 to 30, more preferably 2 to 20, most preferably 2 to 12 carbon atoms, e.g., propargyl and 3-pentynyl), and alkylene groups (e.g., dimethylene and trimethylene). Preferred of these are alkyl groups, alkenyl groups, and alkylene groups. More preferred of these are methyl, ethyl, propyl, butyl, allyl, dimethylene, and trimethylene.

In the case where $R_0$ is an alkylene group, this $R_0$ is preferably bonded to the ring formed with Z or to Q.

Preferred examples of the aryl group represented by $R_0$ include mono- or bicyclic aryl groups having 6 to 30 carbon atoms (e.g., phenyl and naphthyl). More preferred of these are aryl groups having 6 to 20 carbon atoms. Most preferred are aryl groups having 6 to 12 carbon atoms.

The heterocyclic group represented by $R_0$ is a three- to ten-membered, saturated or unsaturated heterocyclic ring containing at least one of nitrogen, oxygen, and sulfur atoms. The heterocyclic ring may be an independent single ring or may form a fused ring together with another ring.

The heterocyclic group is preferably a five- or six-membered aromatic heterocyclic group, more preferably a five- or six-membered aromatic heterocyclic group containing one or more nitrogen atoms, and most preferably a five- or six-membered aromatic heterocyclic group containing one or two nitrogen atoms.

Specific examples of the heterocyclic ring include pyrrolidine, piperidine, piperazine, morpholine, thiophene, furan, pyrrole, imidazole, pyrazole, pyridine, pyrazine, pyridazine, triazole, triazine, indole, indazole, purine, thiazoline, thiazole, thiadiazole, oxazoline, oxazole, oxadiazole, quinoline, isoquinoline, phthalazine, naphthyridine, quinoxaline, quinazoline, cinnoline, pteridine, acridine, phenanthroline, phenazine, tetrazole, benzimidazole, benzoxazole, benzthiazole, benztriazole, and tetrazaindene. Preferred of these heterocyclic rings are pyrrole, imidazole, pyrazole, pyridine, pyrazine, pyridazine, triazole, triazine, indole, indazole, thiadiazole, oxadiazole, quinoline, phthalazine, quinoxaline, quinazoline, cinnoline, tetrazole, thiazole, oxazole, benzimidazole, benzoxazole, benzthiazole, and benztriazole. More preferred of these are imidazole, pyridine, quinoline, thiazole, oxazole, benzimidazole, benzoxazole, benzthiazole, and benztriazole. Most preferred of these are pyridine and quinoline.

The aliphatic hydrocarbon group, aryl group, and heterocyclic group represented by $R_0$ each may have one or more substituents. Examples of the substituents may be the same as those enumerated hereinabove as examples of $R_1$ to $R_6$.

$R_0$ is preferably an alkyl group, an alkenyl group, or an aryl group, and is more preferably an alkyl group, allyl, or phenyl.

n represents 0 or 1, preferably 0.

$L_1$ and $L_2$ each represents a methine group or a substituted methine group, provided that plural $L_1$'s, plural $L_2$'s, or $L_1$ and $L_2$ as a whole may form a four- to six-membered ring formed though substituents thereof.

Examples of the substituents of the substituted methine groups may be the same as those enumerated hereinabove as examples of $R_1$ to $R_6$. Preferred of these are alkyl groups (e.g., methyl and ethyl), aryl groups (e.g., phenyl), aralkyl groups (e.g., benzyl), halogen atoms (e.g., chlorine and bromine), and alkoxy groups (e.g., methoxy and ethoxy). More preferred of these are alkyl groups.

m represents 0, 1, 2, or 3, preferably 0 or 1, more preferably 0.

Q represents a hydrogen atom, an aliphatic hydrocarbon group, an aryl group, or a heterocyclic group, provided that Q may be bonded to $R_0$ to form a ring.

Examples of the aliphatic hydrocarbon group, aryl group, and heterocyclic group represented by Q are the same as those of the aliphatic hydrocarbon group, aryl group, and heterocyclic group represented by $R_0$.

Q is preferably a hydrogen atom, an alkyl group, an alkylene group, or an aryl group, and is more preferably a hydrogen atom or an alkylene group bonded to $R_0$ to form a five- or six-membered ring.

The anion represented by $X^-$ may be either an organic or an inorganic anion. Examples thereof include halide ions (e.g., $Cl^-$, $Br^-$, and $I^-$), sulfonate ions (e.g., trifluoromethanesulfonate, p-toluenesulfonate, benzenesulfonate, and p-chlorobenzenesulfonate), sulfate ions (e.g., methylsulfate and ethylsulfate), perchlorate, tetrafluoroborate, and hexafluoroborate. Preferred of these are halide ions, sulfonate ions, and a perchlorate ion.

r represents an integer of 0 or larger. When the compound forms an intramolecular salt, r is 0.

The compounds represented by formula (I) each may be a polymer consisting of two or more molecules of the compound, or may have been bonded to a polymer chain through any of $R_1$ to $R_6$. Although formula (I) is a limiting structural formula for convenience, the compound according to the present invention may be a tautomer of a compound represented by formula (I).

Preferred among the compounds represented by formula (I) are those represented by formula (I-a):

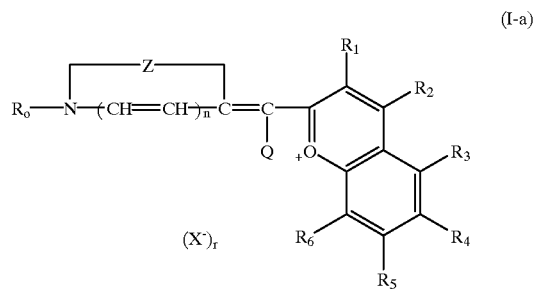

(I-a)

wherein $R_1$, $R_2$, $R_3$, $R_4$, $R_5$, $R_6$, Z, $R_0$, n, Q, $X^-$, and r respectively have the same meanings as in formula (I), and the preferred ranges thereof are also the same.

More preferred among the compounds represented by formula (I) are those represented by formula (1-b):

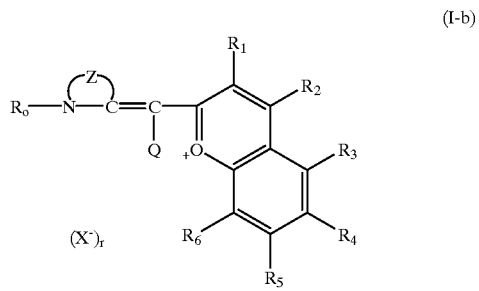

(I-b)

wherein $R_1$, $R_2$, $R_3$, $R_4$, $R_5$, $R_6$, Z, $R_0$, Q, $X^-$, and r respectively have the same meanings as in formula (I), and the preferred ranges thereof are also the same.

Most preferred among the compounds represented by formula (I) are those represented by formula (1-c):

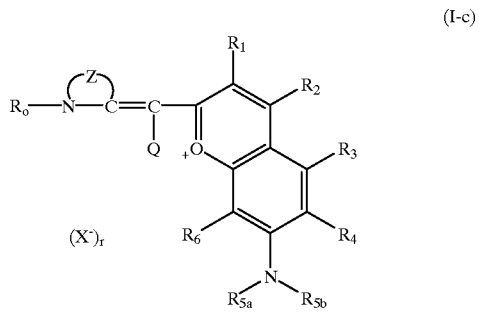

(I-c)

wherein $R_1$, $R_2$, $R_3$, $R_4$, $R_{5a}$, $R_{5b}$, $R_6$, Z, $R_0$, Q, $X^-$, and r respectively have the same meanings as in formula (I), and the preferred ranges thereof are also the same.

Specific examples of the compounds represented by formula (I) are given below, but the present invention should not be construed as being limited thereto.

1.
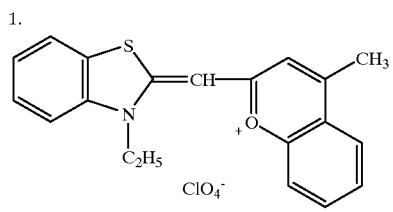
2.
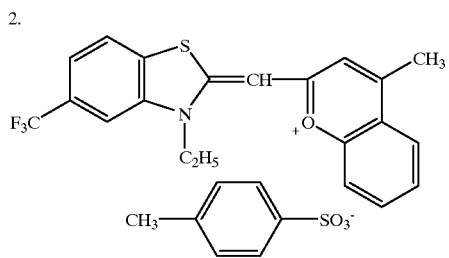
3.
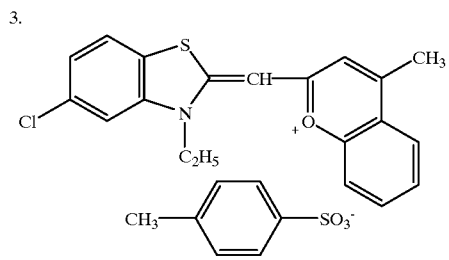
4.
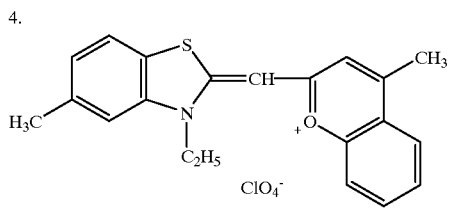
5.
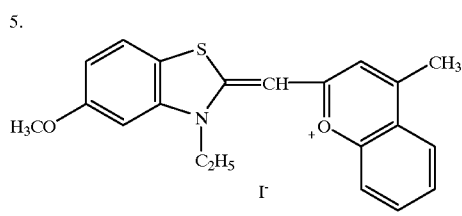
6.
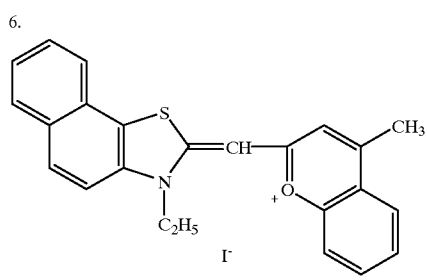
7.
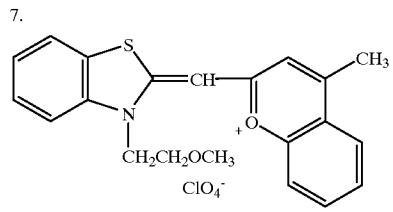
8.
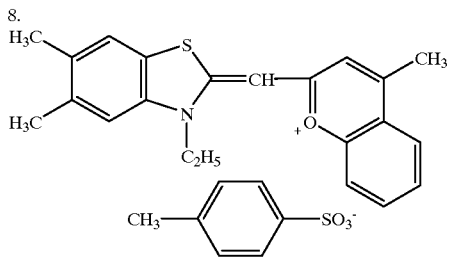
9.
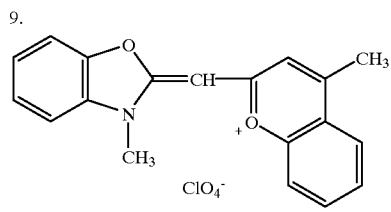
10.
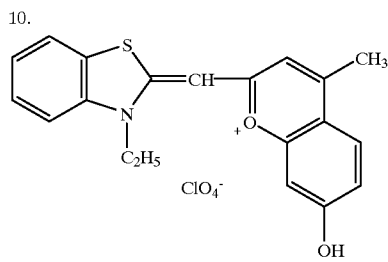
11.
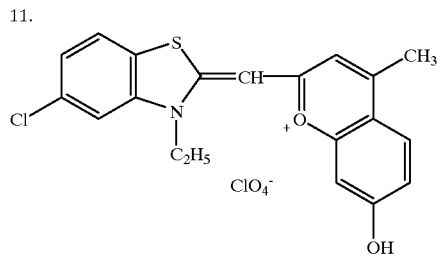
12.
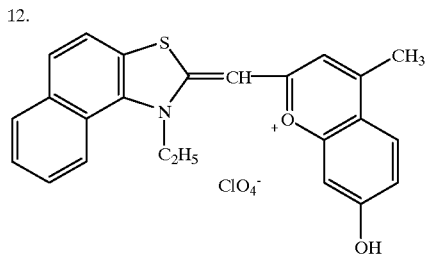

-continued
13.
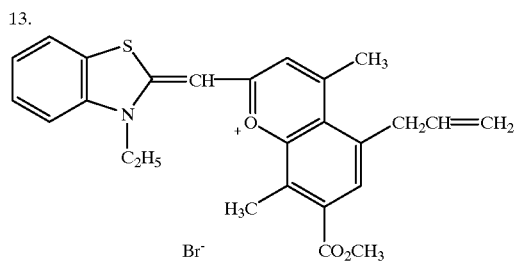
14.
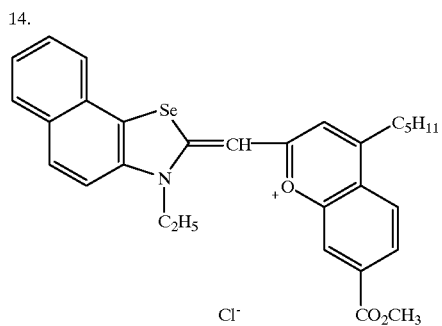
15.
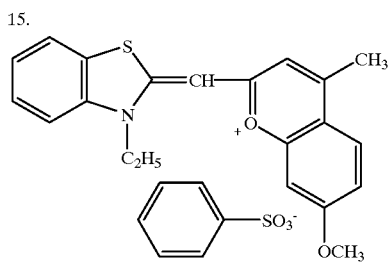
16.
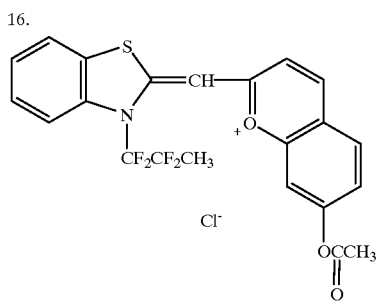
17.
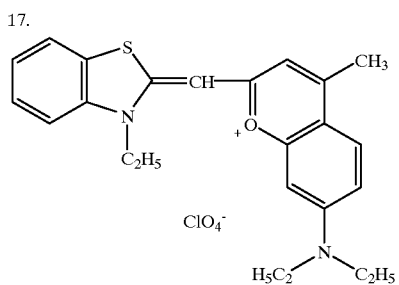
18.
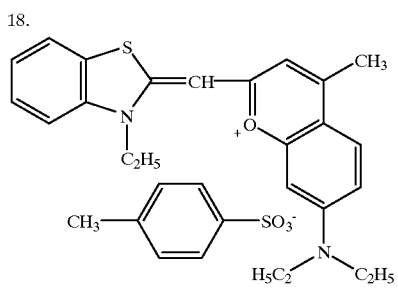
19.
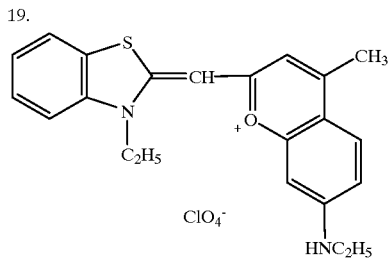
20.
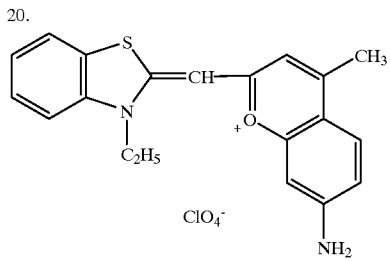
21.
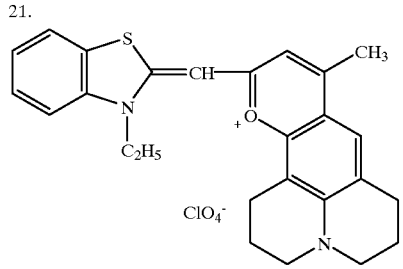
22.
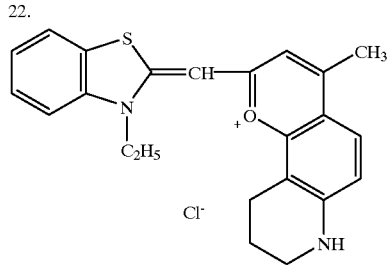

23.
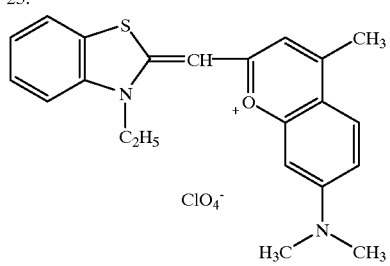
24.
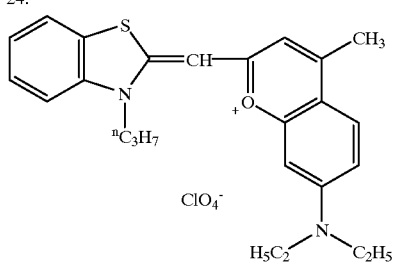
25.
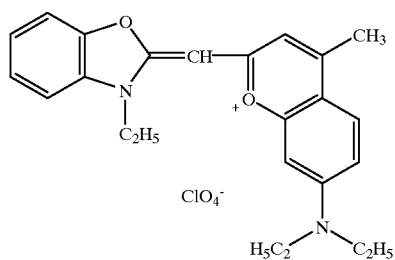
26.
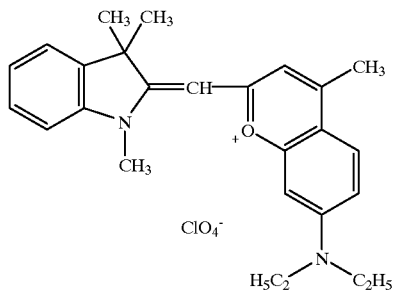
27.
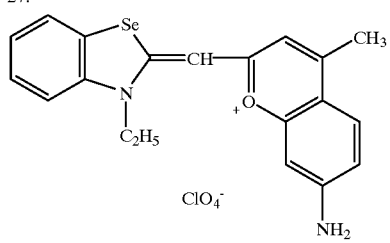
28.
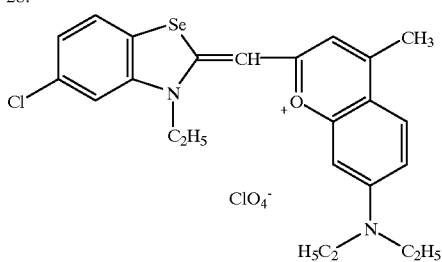
29.
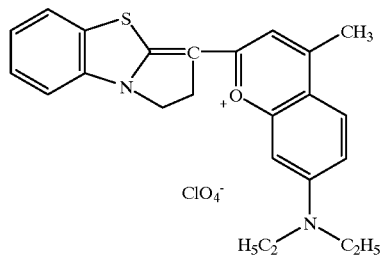
30.
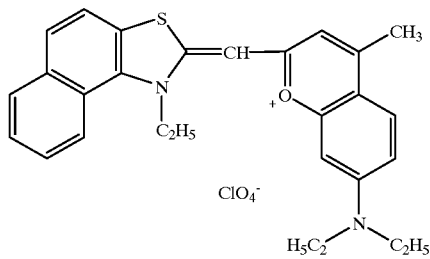
31.
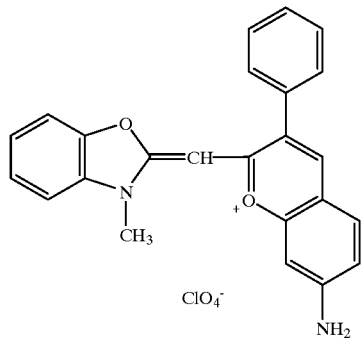
32.
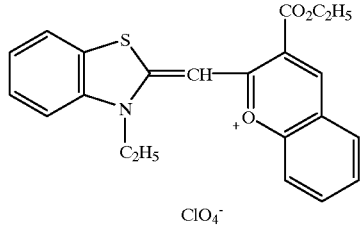

-continued
33.
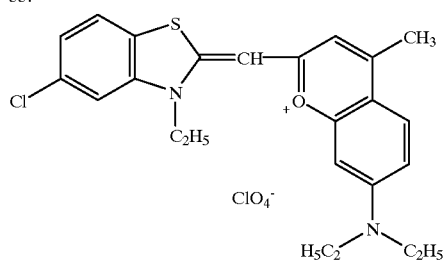
34.
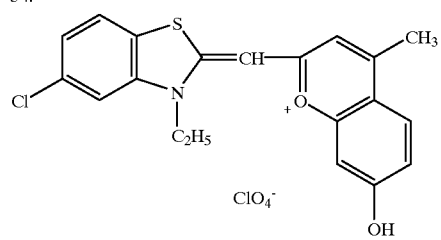
35.
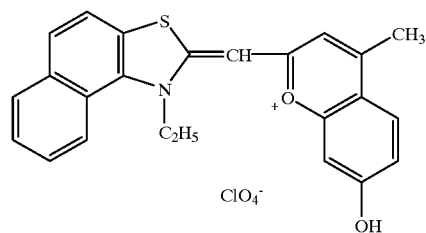
36.
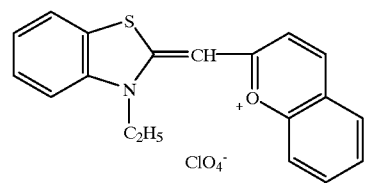
37.
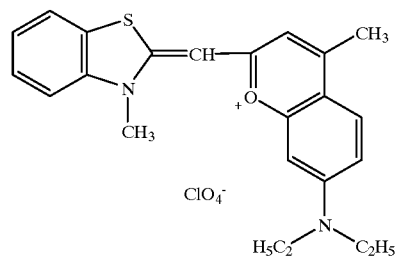
38.
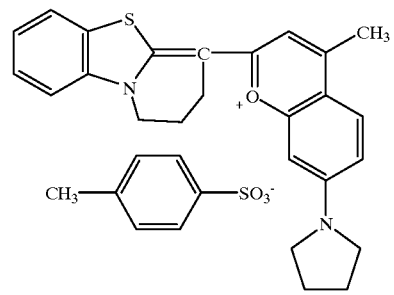
39.
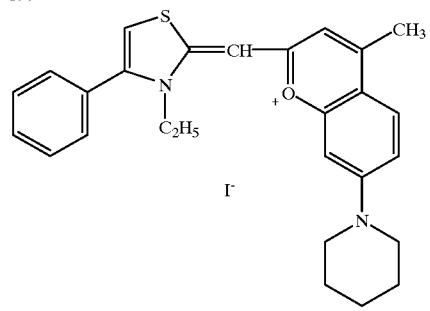
40.
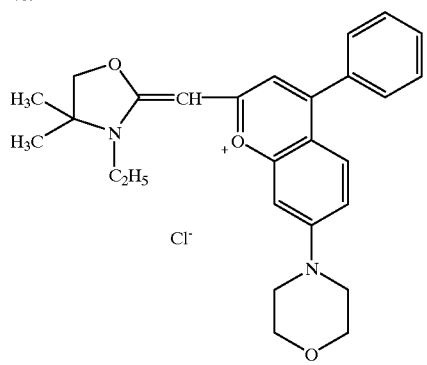
41.
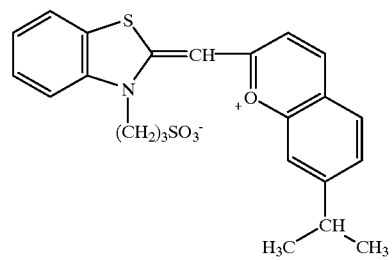
42.
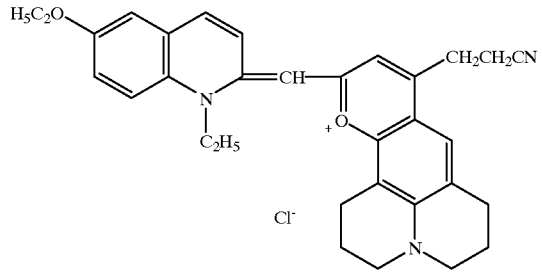

43. 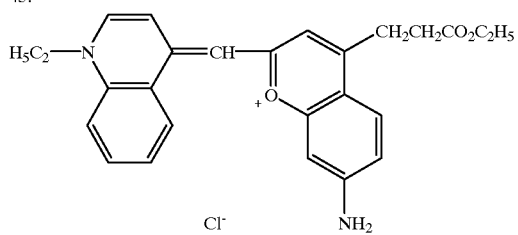
44. 
45. 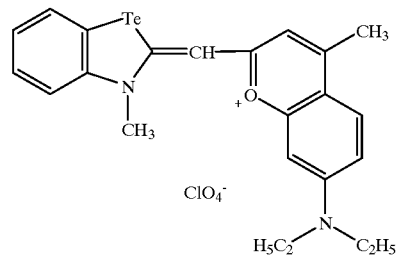
46. 
47. 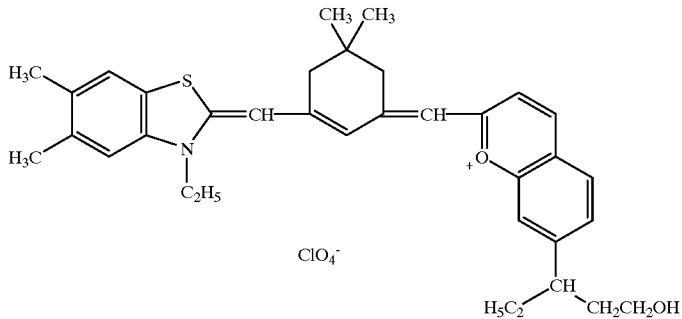
48. 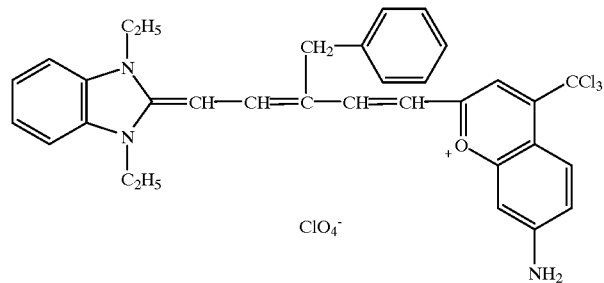
49. 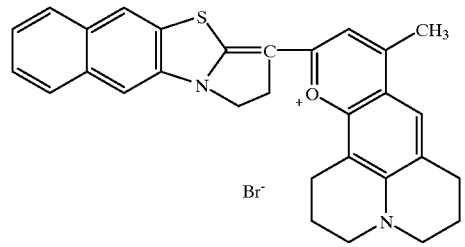

-continued

50.

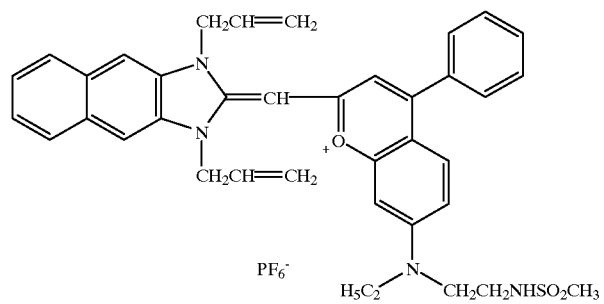

51.

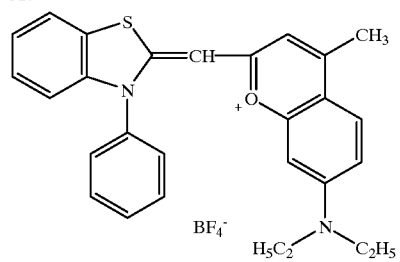

52.

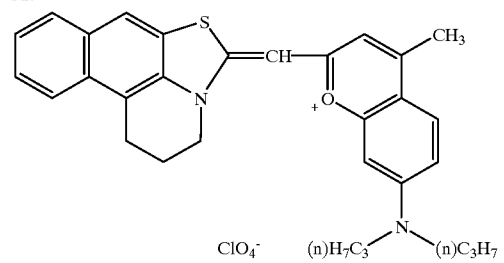

53.

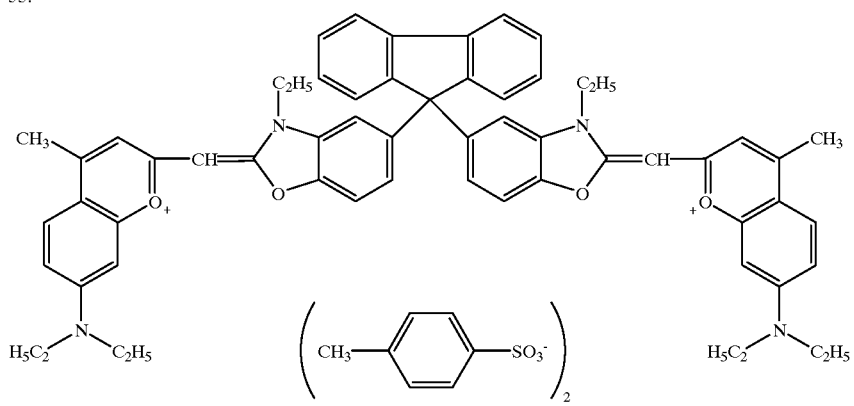

54.

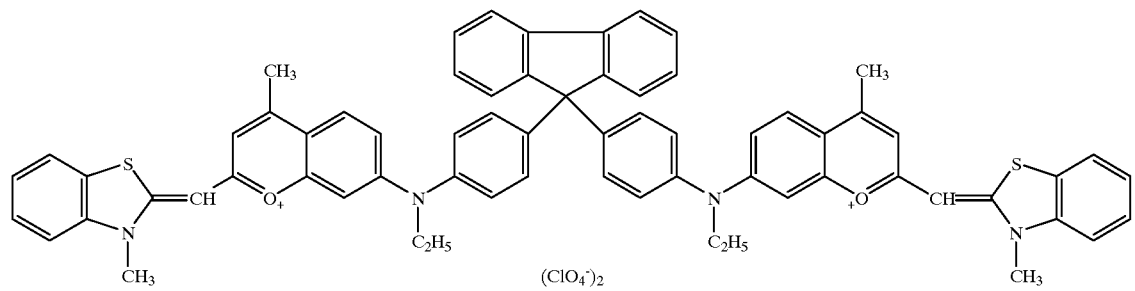

The exemplified compounds given above may be tautomers thereof.

The compounds represented by formula (I) can be synthesized by various synthesis methods. For example, the compounds can be synthesized according to the methods described, e.g., in JP-B-7-16082 (the term "JP-B" as used herein means an "examined Japanese patent publication"), JP-A-2-172916 (the term "JP-A" as used herein means an "unexamined published Japanese patent application"), JP-A-63-263792, JP-A-62-187767, and *Research Disclosure*, Vol.163, No.16325, pp.29–32 (November, 1977).

The following are synthesis examples for compounds represented by formula (I) according to the present invention.

SYNTHESIS EXAMPLE 1

Synthesis of Exemplified Compound 1

A mixture of 17.5 g of 3-ethyl-2-methylbenzothiazolium p-toluenesulfonate and 8.8 g of 4-methyl-2H-chromene-2-thione was heated at 150° C. to react for 15 hours. To the reaction mixture was added 20 ml of methanol, followed by 40 ml of acetone to give a homogeneous solution. After the solution was cooled to room temperature, 15.7 g of 60% perchloric acid was added. This mixture was stirred at room

SYNTHESIS EXAMPLE 2
Synthesis of Exemplified Compound 2

A mixture of 2.37 g of 5-trifluoromethyl-3-ethyl-2-methylbenzothiazolium p-toluenesulfonate and 1.0 g of 4-methyl-2H-chromene-2-thione was heated at 150° C. to react for 20 hours. To the reaction mixture was added 10 ml of methanol, followed by 10 ml of acetone and 20 ml of ethyl acetate to give a homogeneous solution. This solution was cooled to room temperature, upon which crystals precipitated. The crystals were taken out by filtration, washed with a small amount of acetone, and then added at room temperature to a mixed solvent consisting of 10 ml of methanol, 10 ml of acetone, and 20 ml of ethyl acetate. After the resultant mixture was stirred for 40 minutes, the crystals were taken out by filtration and washed with acetone to obtain 1.47 g of the target compound. (Yield, 46%)

Brown crystals; melting point, 272–273° C. (decomposed)

SYNTHESIS EXAMPLE 3
Synthesis of Exemplified Compound 3

A mixture of 11.1 g of 5-chloro-3-ethyl-2-methylbenzothiazolium p-toluenesulfonate and 5.5 g of 4-methyl-2H-chromene-2-thione was heated at 150° C. to react for 23 hours. To the reaction mixture was added 25 ml of methanol, followed by 50 ml of acetone and 150 ml of ethyl acetate. The resultant solution was cooled to room temperature, upon which crystals precipitated. The crystals were taken out by filtration, washed with a small amount of acetone, and then added at room temperature to a mixed solvent consisting of 25 ml of methanol, 50 ml of acetone, and 150 ml of ethyl acetate. After the resultant mixture was stirred for 20 minutes, the crystals were taken out by filtration and washed with acetone to obtain 7.9 g of the target compound. (Yield, 52%)

Brown crystals; melting point, $\geq$282–283° C. (decomposed)

SYNTHESIS EXAMPLE 4
Synthesis of Exemplified Compound 4

A mixture of 2.07 g of 5-methyl-3-ethyl-2-methylbenzothiazolium p-toluenesulfonate and 1.0 g of 4-methyl-2H-chromene-2-thione was heated at 150° C. to react for 25 hours. To the reaction mixture was added 10 ml of methanol, followed by 10 ml of acetone and 20 ml of ethyl acetate. The resultant solution was cooled to room temperature, upon which crystals precipitated. The crystals were taken out by filtration and washed with a small amount of acetone. Thereto were added at room temperature 20 ml of methanol and 40 ml of acetone to give a homogeneous solution. To the solution was added 5 g of 60% perchloric acid. After the resultant mixture was stirred at room temperature for 30 minutes, the crystals precipitated were taken out by filtration and washed with acetone to obtain 1.46 g of the target compound. (Yield, 55%)

Brown crystals; melting point, $\geq$270–275° C. (decomposed)

SYNTHESIS EXAMPLE 5
Synthesis of Exemplified Compound 5

A mixture of 2.15 g of 5-methoxy-3-ethyl-2-methylbenzothiazolium p-toluenesulfonate and 1.0 g of 4-methyl-2H-chromene-2-thione was heated at 150° C. to react for 20 hours. To the reaction mixture was added 15 ml of methanol, followed by 12 ml of acetone to give a homogeneous solution. To this solution was dropwise added 1.7 g of sodium iodide (solution in 5 ml of acetone). This mixture was stirred at room temperature, upon which crystals precipitated. The crystals were taken out by filtration, washed with a small amount of acetone, and then added at room temperature to 20 ml of water. After the resultant mixture was stirred for 15 minutes, the crystals were taken out by filtration and washed with acetone to obtain 1.29 g of the target compound. (Yield, 48%)

Brown crystals; melting point, 273–274° C. (decomposed)

SYNTHESIS EXAMPLE 6
Synthesis of Exemplified Compound 6

A mixture of 2.27 g of 3-ethyl-2-methylnaphtho[2,1-d]thiazolium p-toluenesulfonate and 1.0 g of 4-methyl-2H-chromene-2-thione was heated at 150° C. to react for 21 hours. To the reaction mixture was added 8 ml of methanol, followed by 12 ml of acetone to give a homogeneous solution. To this solution was dropwise added 1.7 g of sodium iodide (solution in 5 ml of water). This mixture was stirred at room temperature, upon which crystals precipitated. The crystals were taken out by filtration, washed with a small amount of acetone, and then added at room temperature to a mixed solvent consisting of 15 ml of water and 15 ml of acetone. After the resultant mixture was stirred for 15 minutes, the crystals were taken out by filtration and washed with acetone to obtain 1.11 g of the target compound. (Yield, 39%)

Brown crystals; melting point, $\geq$280° C. (decomposed)

SYNTHESIS EXAMPLE 7
Synthesis of Exemplified Compound 7

From 4.3 g of 3-(2-methoxyethyl)-2-methylbenzothiazolium p-toluenesulfonate and 1.0 g of 4-methyl-2H-chromene-2-thione was obtained 1.1 g of the target compound in the same manner as in Synthesis Example 1. (Yield, 43%)

Brown crystals; melting point, $\geq$280° C. (decomposed)

SYNTHESIS EXAMPLE 8
Synthesis of Exemplified Compound 8

A mixture of 26.0 g of 5,6-dimethyl-3-ethyl-2-methylbenzothiazolium p-toluenesulfonate and 13.2 g of 4-methyl-2H-chromene-2-thione was heated at 150° C. to react for 17 hours. To the reaction mixture was added 50 ml of methanol, followed by 100 ml of acetone. The resultant solution was cooled to room temperature, upon which crystals precipitated. The crystals were taken out by filtration, washed with a small amount of acetone, and then added at room temperature to a mixed solvent consisting of 50 ml of methanol, 100 ml of acetone, and 300 ml of ethyl acetate. After the resultant mixture was stirred for 20 minutes, the crystals were taken out by filtration and washed with acetone to obtain 16.2 g of the target compound. (Yield, 45%)

Brown crystals; melting point, $\geq$201–203° C. (decomposed)

SYNTHESIS EXAMPLE 9
Synthesis of Exemplified Compound 9

A mixture of 2.1 g of 2,3-dimethylbenzoxazolium p-toluenesulfonate and 1.2 g of 4-methyl-2H-chromene-2- thione was heated at 150° C. to react for 10 hours. To the reaction mixture was added 15 ml of methanol, followed by 12 ml of acetone to give a homogeneous solution. To this solution was dropwise added 1.2 g of sodium perchlorate (solution in 5 ml of water). This mixture was stirred at room temperature, upon which crystals precipitated. The crystals were taken out by filtration, washed with a small amount of acetone, and then added at room temperature to a mixed solvent consisting of 10 ml of water, 10 ml of methanol, and 20 ml of ethyl acetate. After the resultant mixture was stirred for 15 minutes, the crystals were taken out by filtration and washed with acetone to obtain 0.8 g of the target compound. (Yield, 12%)

Brown crystals; melting point, $\geq 269–271°$ C. (decomposed)

SYNTHESIS EXAMPLE 10
Synthesis of Exemplified Compound 17

A mixture of 28.1 g of 3-ethyl-2-methylbenzothiazolium p-toluenesulfonate and 19.9 g of 7-diethylamino-4-methyl-2H-chromene-2-thione was heated at 150° C. to react for 18 hours. The resultant reaction product was purified by silica gel column chromatography (developing solvent: methanol/chloroform=1/5 by volume). The crude crystals obtained were dissolved in 500 ml of methanol, and a solution prepared by dissolving 9.6 g of sodium perchlorate in 200 ml of water was added thereto. This mixture was stirred at room temperature, upon which crystals precipitated. The crystals were taken out by filtration and then recrystallized from a methanol/chloroform mixed solvent to obtain 8.0 g of the target compound. (Yield, 20%)

Dark-green crystals

SYNTHESIS EXAMPLE 11
Synthesis of Exemplified Compound 19

From 28.1 g of 3-ethyl-2-methylbenzothiazolium p-toluenesulfonate and 17.6 g of 7-ethylamino-4-methyl-2H-chromene-2-thione was obtained 7.9 g of the target compound in the same manner as in Synthesis Example 10. (Yield, 22%)

Dark-green crystals

SYNTHESIS EXAMPLE 12
Synthesis of Exemplified Compound 24

From 32.0 g of 3-propyl-2-methylbenzothiazolium bromide and 29.0 g of 7-diethylamino-4-methyl-2H-chromene-2-thione was obtained 7.7 g of the target compound in the same manner as in Synthesis Example 10. (Yield, 13%)

Bright-green crystals

SYNTHESIS EXAMPLE 13
Synthesis of Exemplified Compound 11

From 12.0 g of 5-chloro-3-ethyl-2-methylbenzothiazolium p-toluenesulfonate and 6.0 g of 7-hydroxy-4-methyl-2H-chromene-2-thione was obtained 3.0 g of the target compound in the same manner as in Synthesis Example 10. (Yield, 20%)

Orange crystals

SYNTHESIS EXAMPLE 14
Synthesis of Exemplified Compound 25

From 17.5 g of 3-ethyl-2-methylbenzoxazolium p-toluenesulfonate and 13.0 g of 7-diethylamino-4-methyl-2H-chromene-2-thione was obtained 1.8 g of the target compound in the same manner as in Synthesis Example 10. (Yield, 7%)

Bright-green crystals

SYNTHESIS EXAMPLE 15
Synthesis of Exemplified Compound 26

A mixture of 11.3 g of 1,2,3,3-tetramethylindolinium bromide and 11.0 g of 7-diethylamino-4-methyl-2H-chromene-2-thione was heated at 150° C. to react for 18 hours. The resultant reaction product was purified by silica gel column chromatography (developing solvent: methanol/chloroform=1/9 by volume). The crude crystals obtained were dissolved in 400 ml of methanol, and a solution prepared by dissolving 8.7 g of sodium perchlorate in 150 ml of water was added thereto. This mixture was stirred at room temperature, upon which crystals precipitated. The crystals were taken out by filtration and then recrystallized from a methanol/ether mixed solvent to obtain 3.4 g of the target compound. (Yield, 20%)

Bright-green crystals

SYNTHESIS EXAMPLE 16
Synthesis of Exemplified Compound 27

From 40.0 g of 3-ethyl-2-methylbenzoselenazolium p-toluenesulfonate and 29.0 g of 7-amino-4-methyl-2H-chromene-2-thione was obtained 3.1 g of the target compound in the same manner as in Synthesis Example 10. (Yield, 6%)

Reddish-brown crystals

SYNTHESIS EXAMPLE 17
Synthesis of Exemplified Compound 20

From 2.8 g of 3-ethyl-2-methylbenzothiazolium p-toluenesulfonate and 2.0 g of 7-amino-4-methyl-2H-chromene-2-thione was obtained 0.6 g of the target compound in the same manner as in Synthesis Example 10. (Yield, 26%)

Reddish-brown crystals

SYNTHESIS EXAMPLE 18
Synthesis of Exemplified Compound 28

From 9.6 g of 5-chloro-3-ethyl-2-methylbenzoselenazolium p-toluenesulfonate and 5.5 g of 7-diethylamino-4-methyl-2H-chromene-2-thione was obtained 1.0 g of the target compound in the same manner as in Synthesis Example 10. (Yield, 8%)

Reddish-brown crystals

SYNTHESIS EXAMPLE 19
Synthesis of Exemplified Compound 29

From 25.6 g of 2,3-trimethylenebenzothiazolium bromide and 29.9 g of 7-diethylamino-4-methyl-2H-chromene-2-thione was obtained 3.0 g of the target compound in the same manner as in Synthesis Example 10. (Yield, 6%)

Bright-green crystals

SYNTHESIS EXAMPLE 20
Synthesis of Exemplified Compound 30

From 32.2 g of 3-ethyl-2-methylnaphtho[1,2-d]thiazolium p-toluenesulfonate and 20.0 g of 7-diethylamino-4-methyl-2H-chromene-2-thione was obtained 4.6 g of the target compound in the same manner as in Synthesis Example 10. (Yield, 11%)

Dark-green crystals

SYNTHESIS EXAMPLE 21
Synthesis of Exemplified Compound 31

A mixture 0 30.0 g of 2,3-dimethylbenzoxazolium p-toluenesulfonate and 25.0 g of 7-amino-3-phenyl-2H-chromene-2-thione was heated at 150° C. to react for 20 hours. The resultant reaction product was purified by silica gel column chromatography (developing solvent: methanol/ chloroform=2/8 by volume). The crude crystals obtained were dissolved in 100 ml of methanol, and 15.7 g of 60% perchloric acid was added thereto. This mixture was stirred at room temperature, upon which crystals precipitated. The crystals were taken out by filtration and then recrystallized from a methanol/chloroform mixed solvent to obtain 20.5 g of the target compound. (Yield, 45%)

Reddish-brown crystals

SYNTHESIS EXAMPLE 22

Synthesis of Exemplified Compound 32

A mixture of 10.4 g of 3-ethyl-2-methylbenzothiazolium p-toluenesulfonate and 7.0 g of 3-ethoxycarbonyl-2H-chromene-2-thione was heated at 150° C. to react for 15 hours. The resultant reaction product was purified by silica gel column chromatography (developing solvent: methanol/chloroform=2/8 by volume). The crude crystals obtained were dissolved in 80 ml of methanol, and 10.0 g of 60% perchloric acid was added thereto. This mixture was stirred at room temperature, upon which crystals precipitated. The crystals were taken out by filtration and then recrystallized from a 2,2,3,3-tetrafluoropropanol/ethanol mixed solvent to obtain 8.1 g of the target compound. (Yield, 57%)

Brown crystals

SYNTHESIS EXAMPLE 23

Synthesis of Exemplified Compound 33

From 31.0 g of 5-chloro-3-ethyl-2-methylbenzothiazolium p-toluenesulfonate and 20.0 g of 7-diethylamino-4-methyl-2H-chromene-2-thione was obtained 8.2 g of the target compound in the same manner as in Synthesis Example 10. (Yield, 19%)

Bright-green crystals

SYNTHESIS EXAMPLE 24

Synthesis of Exemplified Compound 34

From 12.0 g of 5-chloro-3-ethyl-2-methylbenzothiazolium p-toluenesulfonate and 6.0 g of 7-hydroxy-4-methyl-2H-chromene-2-thione was obtained 3.0 g of the target compound in the same manner as in Synthesis Example 10. (Yield, 20%)

Orange crystals

SYNTHESIS EXAMPLE 25

Synthesis of Exemplified Compound 35

From 15.8 g of 3-ethyl-2-methylnaphtho[1,2-d]thiazolium p-toluenesulfonate and 7.6 q of 7-hydroxy-4-methyl-2H-chromene-2-thione was obtained 0.7 g of the target compound in the same manner as in Synthesis Example 10. (Yield, 4%)

Brown crystals

SYNTHESIS EXAMPLE 26

Synthesis of Exemplified Compound 36

From 3.5 g of 3-ethyl-2-methylbenzothiazolium p-toluenesulfonate and 1.8 g of 2H-chromene-2-thione was obtained 1.3 g of the target compound in the same manner as in Synthesis Example 10. (Yield, 32%)

Brown crystals

SYNTHESIS EXAMPLE 27

Synthesis of Exemplified Compound 37

From 9.7 g of 2,3-dimethylbenzothiazolium p-toluenesulfonate and 9.0 g of 7-diethylamino-4-methyl-2H-chromene-2-thione was obtained 3.5 g of the target compound in the same manner as in Synthesis Example 10. (Yield, 25%)

Bright-green crystals

SYNTHESIS EXAMPLE 28

Synthesis of Exemplified Compound 21

From 12.8 g of 3-ethyl-2-methylbenzothiazolium p-toluenesulfonate and 10.0 g of thione compound "a" shown below was obtained 2.9 g of the target compound in the same manner as in Synthesis Example 10. (Yield, 15%)

Black crystals

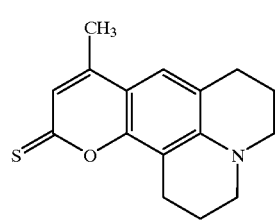

a

Although use of the compounds represented by formula (I) according to the present invention as EL element materials is not particularly limited, it is preferred to use the compounds as luminescent materials. Methods for forming a layer containing a compound represented by formula (I) according to the present invention are not particularly limited. However, use may be made of vapor deposition with resistance heating, electron beams, sputtering, molecular-layer accumulation, coating methods, and the like. Preferred of these from the standpoints of properties and production are vapor deposition with resistance heating and coating methods.

The luminescent element of the present invention comprises a pair of electrodes, i.e., an anode and a cathode, and formed therebetween either a luminescent layer or plural thin organic-compound layers containing a luminescent layer. Besides the luminescent layer, the element may have a hole-injecting layer, hole-transporting layer, electron-injecting layer, electron-transporting layer, protective layer, etc. Each of these layers may have one or more other functions. Each layer can be constituted of various materials.

The use amount of the compound according to the present invention is generally from $10^{-10}$ to $10^2$ g/m$^2$, preferably from $10^{-8}$ to 10 g/m$^2$.

The anode serves to feed holes to the hole-injecting layer, hole-transporting layer, luminescent layer, etc. It can be made of a metal, an alloy, a metal oxide, an electroconductive compound, a mixture of two or more thereof, or the like, and is preferably made of a material having a work function of 4 eV or higher. Examples of such anode materials include electroconductive metal oxides such as tin oxide, zinc oxide, indium oxide, and indium-tin oxide (hereinafter referred to as "ITO"); metals such as gold, silver, chromium, and nickel; mixtures or multilayer structures each comprising one or more of those metals and one or more of those electroconductive metal oxides; inorganic electroconductive substances such as copper iodide and copper sulfide; organic electroconductive materials such as polyaniline, polythiophene, and polypyrrole; and multilayer structures comprising one or more of these and ITO. Preferred of these are electroconductive metal oxides. In particular, ITO is preferred from the standpoints of productivity, high electrical conductivity, transparency, etc. Although the thickness of the anode can be suitably selected according to the material thereof, it is generally preferably from 10 nm to 5 µm, more preferably from 50 nm to 1 µm, most preferably from 100 nm to 500 nm.

In general, an anode layer for use in the luminescent element is formed on a substrate such as, e.g., a soda-lime glass, alkali-free glass, or transparent resin substrate. In the case where a glass is used, the glass is preferably an alkali-free glass for the purpose of diminishing ion dissolution from the glass. In the case of using a soda-lime glass, it preferably has a barrier coat comprising, e.g., silica. The thickness of the substrate is not particularly limited as long as it is sufficient for maintaining a mechanical strength. However, in the case of using a glass, the thickness thereof is generally 0.2 mm or larger, preferably 0.7 mm or larger.

For producing the anode, various methods are used according to materials. For example, in the case of ITO, a film thereof is formed by the electron beam method, sputtering, vapor deposition with resistance heating, a chemical reaction method (sol-gel method), coating with an indium-tin oxide dispersion, etc.

Cleaning the anode or otherwise treating the same is effective in lowering the driving voltage of the element or heightening the efficiency of luminescence. In the case of ITO, for example, UV-ozone treatment or the like is effective.

The cathode serves to feed electrons to the electron-injecting layer, electron-transporting layer, luminescent layer, etc. Adhesion to the layer adjacent to the negative electrode, e.g., the electron-injecting, electron-transporting, or luminescent layer, ionization potential, stability, and others are taken in account when selecting a cathode. The cathode can be made of a material such as a metal, an alloy, a metal oxide, an electroconductive compound, or a mixture of two or more thereof. Examples of such cathode materials include alkali metals (e.g., Li, Na, and K) or their fluorides, alkaline earth metals (e.g., Mg and Ca) or their fluorides, gold, silver, lead, aluminum, sodium-potassium alloys or mixtures of the metals, lithium-aluminum alloys or mixtures of the metals, magnesium-silver alloys or mixtures of the metals, and rare earth metals such as indium and ytterbium. Preferred of these are the materials having a work function of 4 eV or lower. More preferred are aluminum, lithium-aluminum alloys or mixtures of the metals, magnesium-silver alloys or mixtures of the metals, and the like. Although the thickness of the cathode can be suitably selected according to the material thereof, it is generally preferably from 10 nm to 5 $\mu$m, more preferably from 50 nm to 1 $\mu$m, most preferably from 100 nm to 1 $\mu$m.

For producing the cathode, a method such as the electron beam method, sputtering, vapor deposition with resistance heating, or coating is used. It is possible to vapor-deposit an elemental metal or to simultaneously vapor-deposit two or more ingredients. It is also possible to simultaneously vapor-deposit two or more metals to form an alloy electrode. Alternatively, an alloy prepared beforehand may be subjected to vapor deposition.

The anode and the cathode each preferably has a lower sheet resistance, specifically several hundreds $\Omega/\square$ or lower.

The luminescent layer may be made of any material capable of forming a layer which not only has such a function that upon application of an electric field, holes can be injected thereinto from the anode or from the hole-injecting or hole-transporting layer and, at the same time, electrons can be injected thereinto from the cathode or from the electron-injecting or electron-transporting layer, but also functions to allow the injected charges to move therethrough and functions to provide a place where holes recombine with electrons to cause luminescence. Although the luminescent layer preferably contains the compound represented by formula (I) according to the present invention, a luminescent material other than the compound represented by formula (I) according to the present invention may be used. Examples of such other luminescent materials include benzoxazole derivatives, benzimidazole derivatives, benzothiazole derivatives, styrylbenzene derivatives, polyphenyl derivatives, diphenylbutadiene derivatives, tetraphenylbutadiene derivatives, naphthalimide derivatives, coumarin derivatives, perylene derivatives, perinone derivatives, oxadiazole derivatives, aldazine derivatives, pyrralidine derivatives, cyclopentadiene derivatives, bisstyrylanthracene derivatives, quinacridone derivatives, pyrrolopyridine derivatives, thiadiazolopyridine derivatives, cyclopentadiene derivatives, styrylamine derivatives, aromatic dimethylidyne compounds, various metal complexes represented by metal complexes and rare-earth complexes of 8-quinolinol derivatives, and polymeric compounds such as polythiophene, polyphenylene, and polyphenylenevinylene. Although the thickness of the luminescent layer is not particularly limited, it is generally preferably from 1 nm to 5 $\mu$m, more preferably from 5 nm to 1 $\mu$m, most preferably from 10 nm to 500 nm.

Methods for forming the luminescent layer are not particularly limited. Usable methods include vapor deposition with resistance heating, the electron beam method, sputtering, molecular-layer accumulation, coating methods (e.g., spin coating, casting, and dip coating), and the LB (Langmuir Blodgett) method. Preferred of these are vapor deposition with resistance heating and coating methods.

The hole-injecting layer and the hole-transporting layer each may be made of any material which has such a function that holes can be injected thereinto from the anode or which functions to transport holes or to barrier the electrons injected from the cathode. Examples of such materials include carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidyne compounds, porphyrin compounds, polysilane compounds, poly(N-vinylcarbazole) derivatives, aniline copolymers, and electroconductive high-molecular oligomers such as thiophene oligomers and polythiophene. Although the thicknesses of the hole-injecting layer and hole-transporting layer are not particularly limited, they are generally preferably from 1 nm to 5 $\mu$m, more preferably from 5 nm to 1 $\mu$m, most preferably from 10 nm to 500 nm. The hole-injecting layer and the hole-transporting layer each may have a single-layer structure consisting of one or more of the materials enumerated above, or may have a multilayer structure composed of two or more layers having the same or different compositions.

Usable methods for forming the hole-injecting layer and the hole-transporting layer include vapor deposition, the LB method, and a coating method in which a solution or dispersion of any of the aforementioned hole-injecting/transporting agents in a solvent is applied (e.g., by spin coating, casting, or dip coating). In the case of the coating method, the active ingredient can be dissolved or dispersed together with a resin ingredient. Examples of the resin ingredient include poly(vinyl chloride), polycarbonates, polystyrene, poly(methyl methacrylate), poly(butyl methacrylate), polyesters, polysulfones, poly(phenylene oxide)s, polybutadiene, poly(N-vinylcarbazole), hydrocarbon resins, ketone resins, phenoxy resins, polyamides, ethyl cellulose, poly(vinyl acetate), ABS resins, polyurethanes, melamine resins, unsaturated polyester resins, alkyd resins, epoxy resins, and silicone resins.

The electron-injecting layer and the electron-transporting layer each may be made of any material which has such a function that electrons can be injected thereinto from the cathode or which functions to transport electrons or to barrier the holes injected from the anode. Examples of such materials include triazole derivatives, oxazole derivatives, oxadiazole derivatives, fluorenone derivatives, anthraquinodimethane derivatives, anthrone derivatives, diphenylquinone derivatives, thiopyran dioxide derivatives, carbodiimide derivatives, fluorenylidenemethane derivatives, distyrylpyrazine derivatives, tetracarboxylic anhydrides of heterocyclic compounds, e.g., naphthalene, perillene, phthalocyanine derivatives, and various metal complexes represented by metal complexes of 8-quinolinol derivatives, metal phthalocyanines, and metal complexes containing benzoxazole or benzothiazole as a ligand. Although the thicknesses of the electron-injecting layer and electron-transporting layer are not particularly limited, they are generally preferably from 1 nm to 5 μm, more preferably from 5 nm to 1 μm, most preferably from 10 nm to 500 nm. The electron-injecting layer and the electron-transporting layer may have a single-layer structure consisting of one or more of the materials enumerated above, or may have a multilayer structure composed of two or more layers having the same or different compositions.

Usable methods for forming the electron-injecting layer and the electron-transporting layer include vapor deposition, the LB method, and a coating method in which a solution or dispersion of any of the aforementioned electron-injecting/transporting agents in a solvent is applied (e.g., by spin coating, casting, or dip coating). In the case of the coating method, the active ingredient can be dissolved or dispersed together with a resin ingredient. Examples of this resin ingredient are the same as those enumerated hereinabove with regard to the hole-injecting/transporting layer.

The protective layer may be made of any material which functions to inhibit any substance which accelerates element deterioration, e.g., water or oxygen, from coming into the element. Examples of such materials include metals such as In, Sn, Pb, Au, Cu, Ag, Al, Ti, and Ni, metal oxides such as MgO, SiO, $SiO_2$, $Al_2O_3$, GeO, NiO, CaO, BaO, $Fe_2O_3$, $Y_2O_3$, and $TiO_2$, metal fluorides such as $MgF_2$, LiF, $AlF_3$, and $CaF_2$, polyethylene, polypropylene, poly(methyl methacrylate), polyimides, polyureas, polytetrafluoroethylene, polychlorotrifluoroethylene, polydichlorodifluoroethylene, copolymers of chlorotrifluoroethylene and dichlorodifluoroethylene, copolymers obtained by copolymerizing a monomer mixture comprising tetrafluoroethylene and at least one comonomer, fluorinated copolymers comprising a copolymer backbone having one or more ring structures, water-absorbing substances having a water absorption of 1% or higher, and moisture barrier substances having a water absorption of 0.1% or lower.

Methods for forming the protective layer are also not particularly limited. Usable methods include vacuum vapor deposition, sputtering, reactive sputtering, MBE (molecular-beam epitaxy), the cluster ion beam method, ion plating, plasma polymerization (high-frequency excitation ion plating), plasma-assisted CVD, laser-assisted CVD, heat-assisted CVD, gas-source CVD, and coating.

The present invention will be explained below in more detail by reference to Examples, but the invention should not be construed as being limited thereto.

EXAMPLE 1

A glass substrate which had dimensions of 25 mm×25 mm×0.7 mm and on which an ITO film having a thickness of 150 nm had been formed by vapor deposition (manufactured by Tokyo Sanyo Shinku K.K.) was used as a transparent substrate. This transparent substrate was etched, cleaned, and then spin-coated at 3,000 rpm with a solution prepared by dissolving 40 mg of poly(N-vinylcarbazole), 12 mg of 2-(4-biphenylyl)-5-(4-tert-butylphenyl)-1,3,4-oxadiazole, and $3.0\times10^{-6}$ mol of each compound shown in Table 1 in 3 ml of 1,2-dichloroethane. Subsequently, aluminum was vapor-deposited as a cathode in a vacuum of $10^{-5}$ to $10^{-6}$ Torr at a substrate temperature of room temperature.

A DC voltage was applied to the resultant element in the air, with the ITO electrode and the aluminum electrode as the anode and cathode, respectively, to evaluate the luminescent properties thereof.

The evaluation results obtained are shown in Table 1.

TABLE 1

| Sample No. | Compound | Minimum driving voltage (V) | Luminescence wavelength $\lambda_{max}$ (mn) | Maximum luminance (cd/m$^2$) | Generation of dark spot | Remarks |
|---|---|---|---|---|---|---|
| 1 | comparative compound a | 14 | 596 | 80 | present | comparative |
| 2 | comparative compound b | 13 | 610 | 55 | present | comparative |
| 3 | exemplified compound 8 | 10 | 560 | 125 | none | present invention |
| 4 | exemplified compound 10 | 10 | 598 | 130 | none | present invention |
| 5 | exemplified compound 11 | 9 | 588 | 275 | none | present invention |
| 6 | exemplified compound 17 | 7 | 604 | 420 | none | present invention |
| 7 | exemplified compound 18 | 7 | 603 | 420 | none | present invention |
| 8 | exemplified compound 19 | 8 | 600 | 400 | none | present invention |
| 9 | exemplified compound 20 | 9 | 595 | 350 | none | present invention |
| 10 | exemplified compound 21 | 7 | 643 | 450 | none | present invention |

TABLE 1-continued

| Sample No. | Compound | Minimum driving voltage (V) | Luminescence wavelength $\lambda_{max}$ (mn) | Maximum luminance (cd/m$^2$) | Generation of dark spot | Remarks |
|---|---|---|---|---|---|---|
| 11 | exemplified compound 24 | 7 | 607 | 430 | none | present invention |
| 12 | exemplified compound 25 | 8 | 580 | 410 | none | present invention |
| 13 | exemplified compound 26 | 7 | 614 | 430 | none | present invention |
| 14 | exemplified compound 27 | 8 | 608 | 405 | none | present invention |
| 15 | exemplified compound 29 | 7 | 612 | 440 | none | present invention |
| 16 | exemplified compound 30 | 7 | 630 | 445 | none | present invention |

Comparative compound a

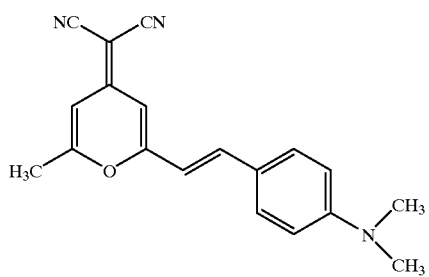

Comparative compound b

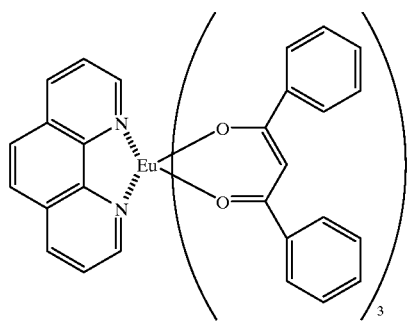

The results given in Table 1 show that as compared with the comparative compounds, the compounds according to the present invention enabled the elements to attain a low driving voltage and a high luminance and to show such excellent durability that the generation of dark spots with the lapse of time was diminished. In particular, satisfactory luminescent properties were obtained even though the luminescent layers had been formed by coating, use of which generally results in a low luminance.

EXAMPLE 2

A glass substrate which had dimensions of 25 mm×25 mm×0.7 mm and on which an ITO film having a thickness of 150 nm had been formed by vapor deposition (manufactured by Tokyo Sanyo Shinku K.K.) was used as a transparent substrate. This transparent substrate was etched, cleaned, and then spin-coated at 5,000 rpm with a solution prepared by dissolving 40 mg of poly(N-vinylcarbazole) and $3.0×10^{-6}$ mol of each compound shown in Table 2 in 3 ml of 1,2-dichloroethane. Subsequently, the zinc complex shown below was vapor-deposited so as to result in a film thickness of 50 nm in a vacuum of $10^{-5}$ to $10^{-6}$ Torr at a substrate temperature of room temperature. On the zinc complex layer were simultaneously vapor-deposited magnesium and silver as a cathode so as to result in a magnesium/silver ratio of 10/1 in a vacuum of $10^{-5}$ to $10^{-6}$ Torr at a substrate temperature of room temperature.

A DC voltage was applied to the resultant element in the air, with the ITO electrode and the Mg/Ag electrode as the anode and cathode, respectively, to evaluate the luminescent properties thereof.

The evaluation results obtained are shown in Table 2. Zinc complex

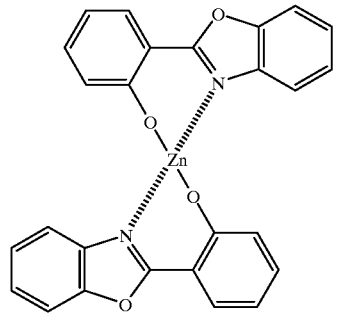

TABLE 2

| Sample No. | Compound | Minimum driving voltage (V) | Luminescence wavelength $\lambda_{max}$ (nm) | Maximum luminance (cd/m$^2$) | Generation of dark spot | Remarks |
|---|---|---|---|---|---|---|
| 1 | comparative compound a | 14 | 592 | 110 | present | comparative |
| 2 | comparative compound b | 12 | 608 | 90 | present | comparative |
| 3 | exemplified compound 8 | 9 | 558 | 240 | none | present invention |
| 4 | exemplified compound 10 | 9 | 596 | 250 | none | present invention |
| 5 | exemplified compound 11 | 8 | 587 | 380 | none | present invention |
| 6 | exemplified compound 17 | 6 | 603 | 560 | none | present invention |
| 7 | exemplified compound 18 | 6 | 603 | 560 | none | present invention |
| 8 | exemplified compound 19 | 7 | 600 | 580 | none | present invention |
| 9 | exemplified compound 20 | 8 | 592 | 500 | none | present invention |
| 10 | exemplified compound 21 | 6 | 640 | 700 | none | present invention |
| 11 | exemplified compound 24 | 6 | 605 | 620 | none | present invention |
| 12 | exemplified compound 25 | 7 | 580 | 580 | none | present invention |
| 13 | exemplified compound 26 | 7 | 605 | 600 | none | present invention |
| 14 | exemplified compound 27 | 8 | 608 | 550 | none | present invention |
| 15 | exemplified compound 29 | 6 | 610 | 610 | none | present invention |
| 16 | exemplified compound 30 | 6 | 622 | 620 | none | present invention |

Comparative Compounds a and b are the same as in Example 1.

The results given in Table 2 show that as compared with the comparative compounds, the compounds according to the present invention enabled the elements to attain a low driving voltage and a high luminance and to show such excellent durability that the generation of dark spots with the lapse of time was diminished.

EXAMPLE 3

An ITO glass substrate which had been etched and cleaned in the same manner as in Example 1 was spin-coated at 1,800 rpm with a solution prepared by dissolving 200 mg of poly(N-vinylcarbazole), 60 mg of 2,5-bis(1-naphthyl)-1,3,4-oxadiazole, 10 mg of 1,1,4,4-tetraphenylbutadiene, 0.5 mg of 4-(dicyanomethylene)-2-methyl-6-(4-dimethylaminostyryl)-4H-pyran, and 0.1 mg of Exemplified Compound 29 according to the present invention in 15 ml of 1,2-dichloroethane. Subsequently, magnesium and silver were simultaneously vapor-deposited as a cathode so as to result in a magnesium/silver ratio of 10/1 in a vacuum of $10^{-5}$ to $10^{-6}$ Torr at a thickness of 3,000 Å. Silver was then vapor-deposited at a thickness of 3,000 Å.

A DC voltage was applied to the resultant element, with the ITO electrode and the Mg/Ag electrode as the anode and cathode, respectively, to examine the luminescent properties thereof. As a result, white luminescence (luminance, 1,750 cd/m$^2$) in which the (x, y) in the CIE chromaticity diagram was (0.34, 0.36) was obtained at 12 V. The element was found to be effective in white luminescence.

According to the present invention, an organic EL element can be obtained which has a lower driving voltage, higher luminance, and longer life than conventional ones. In particular, satisfactory luminescent properties are obtained even with coating, use of which generally results in a low luminance. Therefore, the element can be produced advantageously in production cost, etc. Moreover, the compound according to the present invention functions as a doping dye effective in white luminescence.

While the invention has been described in detail and with reference to specific embodiments thereof, it will be apparent to one skilled in the art that various changes and modifications can be made therein without departing from the spirit and scope thereof.

What is claimed is:

1. An organic electroluminescent element comprising a pair of electrodes and, formed therebetween, either a luminescent layer or plural thin organic-compound layers containing a luminescent layer, at least one of said layers being a layer containing an organic electroluminescent element material which is a compound represented by formula (I):

organic electroluminescent element material which is a compound represented by formula (I):

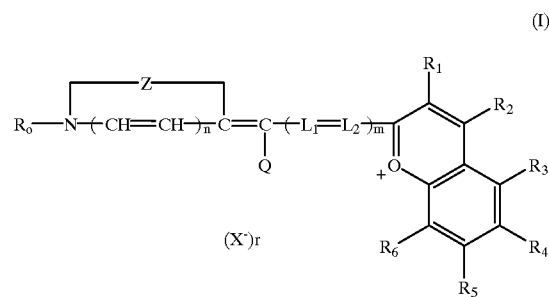

(I)

wherein $R_1$, $R_2$, $R_3$, $R_4$, $R_5$, and $R_6$ each represents a hydrogen atom or a substituent; Z represents a group of atoms necessary for forming a five- or six-membered ring; $R_0$ represents an aliphatic hydrocarbon group, an aryl group, or a heterocyclic group; n represents 0 or 1; $L_1$ and $L_2$ each represents a methine group or a substituted methine group, provided that plural $L_1$'s, plural $L_2$'s, or $L_1$ and $L_2$ as a whole may form a four- to six-membered ring formed through substituents thereof; m represents 0, 1, 2, or 3; Q represents a hydrogen atom, an aliphatic hydrocarbon group, an aryl group, or a heterocyclic group, provided that Q may be bonded to $R_0$ to form a ring; $X^-$ represents an anion; and r represents an integer of 0 or larger, provided that r is 0 when the compound forms an intramolecular salt.

2. An organic electroluminescent element comprising a pair of electrodes and, formed therebetween, either a luminescent layer or plural thin organic-compound layers containing a luminescent layer, at least one of said layers being a layer comprising a polymer and, dispersed therein, an organic electroluminescent element material which is a compound represented by formula (I):

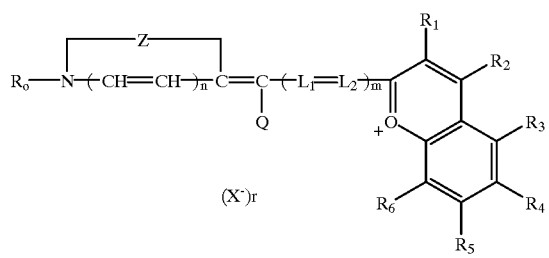

(I)

wherein $R_1$, $R_2$, $R_3$, $R_4$, $R_5$, and $R_6$ each represents a hydrogen atom or a substituent; Z represents a group of atoms necessary for forming a five- or six-membered ring; $R_0$ represents an aliphatic hydrocarbon group, an aryl group, or a heterocyclic group; n represents 0 or 1; $L_1$ and $L_2$ each represents a methine group or a substituted methine group, provided that plural $L_1$'s, plural $L_2$'s, or $L_1$ and $L_2$ as a whole may form a four- to six-membered ring formed through substituents thereof; m represents 0, 1, 2, or 3; Q represents a hydrogen atom, an aliphatic hydrocarbon group, an aryl group, or a heterocyclic group, provided that Q may be bonded to $R_0$ to form a ring; $X^-$ represents an anion; and r represents an integer of 0 or larger, provided that r is 0 when the compound forms an intramolecular salt.

* * * * *